United States Patent [19]

Solomon

[11] 3,967,217

[45] June 29, 1976

[54] MODULATOR FOR DIGITAL MICROWAVE TRANSMITTER

[75] Inventor: Arthur H. Solomon, Winchester, Mass.

[73] Assignee: Arthur D. Little, Inc., Cambridge, Mass.

[22] Filed: Jan. 31, 1975

[21] Appl. No.: 545,788

[52] U.S. Cl. .............................. 332/9 R; 325/38 A; 332/16 R; 332/29 R; 333/31 R
[51] Int. Cl.² .......................................... H03C 3/00
[58] Field of Search ............... 332/9 R, 9 T, 16 R, 332/16 T, 23 R, 29 R, 29 M; 307/268, 271; 333/1.1, 24.1, 31 R; 325/38 A

[56] References Cited
UNITED STATES PATENTS

| | | | |
|---|---|---|---|
| 3,182,203 | 5/1965 | Miller | 333/1.1 X |
| 3,437,958 | 4/1969 | Shaw et al. | 332/23 X |
| 3,460,067 | 8/1969 | Burnsweig | 332/29 R |
| 3,506,930 | 4/1970 | Gantick | 332/16 R |
| 3,562,672 | 2/1971 | Sugimoto et al. | 332/9 R |
| 3,656,069 | 4/1972 | Beccone et al. | 332/16 R |

*Primary Examiner*—John Kominski
*Attorney, Agent, or Firm*—Weingarten, Maxham & Schurgin

[57] ABSTRACT

A microwave modulator especially adapted for use in a digital microwave transmitter and capable of operation over a broad range of data rates and carrier frequencies. The modulator is operative with a multiple level modulation signal having zero average amplitude and provides in response thereto a multiple phase coded signal having zero average phase. A plurality of microwave diodes are disposed in spaced relation along a transmission line and are operative in response to control inputs derived from the modulation signal as signal reflection means to phase modulate the microwave carrier signal.

9 Claims, 4 Drawing Figures

MODULATOR FOR DIGITAL MICROWAVE TRANSMITTER

FIELD OF THE INVENTION

This invention relates to microwave transmission systems and more particularly to phase modulators for a digital microwave transmitter.

BACKGROUND OF THE INVENTION

Data communication systems are known for the conveyance of digital information over a communication path such as a microwave of cable path. Digital information is generally provided to the system at a predetermined data rate, and the system is synchronized to and operative only at the selected rate to transmit the digital signal over the communication path and to recover the digital data at the receiving end. In order to provide synchronization with a particular data rate, appropriate clock or timing apparatus must be provided. In addition, synchronous encoding apparatus must often be provided to translate an input signal to a form suitable for transmission, with similar decoding apparatus provided for translating a received data signal to an intended output format. In known systems operative only at a specified clock rate, a change in the data rate would necessitate physical modification of the apparatus to be operative at the different rate.

A digital communication system capable of operation over a wide range of data rates without system modification is the subject of a copending application Ser. No. 545,790 in the names of Harvey L. Pastan and Arthur H. Solomon, filed of even date herewith and the disclosure of which is incorporated herein by reference. The present invention relates to a phase modulator especially adapted for use in the system of this copending application, although the invention is not limited to such use.

Phase modulators operative at microwave and other frequencies are well known in the art but in general are limited to use at a single carrier frequency or frequency band. In order to accommodate different carrier frequencies, the modulator structure must usually be modified to account for changes in impedance and wavelength at the intended operating frequency. One known modulator is shown in U.S. Pat. No. 3,506,930 wherein a phase shifting network is employed having a plurality of diodes and capacitors spaced along a transmission line. The diodes are selectively rendered conductive and non-conductive in response to control signals derived from the conductive diodes providing short circuits for a modulation signal, reflection of the carrier wave and consequent phase modulation thereof. The disclosure of the aforementioned patent contemplates the use of ideal diode switches which are either substantially conductive or non-conductive and which are not readily realizable in practice, especially at microwave frequencies.

SUMMARY OF THE INVENTION

In accordance with the invention a phase modulator is provided which is especially adapted for use with a digital microwave transmitter and which is capable of operation over a broad range of data rates and carrier frequencies within an intended system bandwidth. The novel modulator employs as a modulation input a multiple level signal having zero or substantially zero average amplitude. In preferred embodiment, the input signal can be a T-carrier signal which is itself of well-known signal format having three amplitude levels with a time average of zero amplitude. The presence of a pulse, which may be either positive or negative, represents one binary state, while the absence of a pulse represents the opposite binary signal state. The phase modulator is operative in response to a T-carrier or similar input signal to provide a multiple phase signal having phase states directly corresponding to the amplitude states of the input signal.

The modulator includes a plurality of microwave diodes such as Schottky diodes disposed at selected spaced positions along a transmission line and having predetermined electrical separation determined by a dielectric phase shifter disposed therebetween. A digital encoder is coupled to the diodes to provide in response to a multiple level input signal respective bias signals in accordance with the amplitude states of the modulating signal. The diodes function as bias controlled variable impedances to provide reflection of the carrier signal in accordance with the equivalent complex impedance and electrical separation of the diodes which determine the relative phase of the reflected wave. The reflected wave is coupled to the modulator output as the phase modulated output signal having phase states directly corresponding to the amplitude states of the modulation signal.

DESCRIPTION OF THE DRAWINGS

The invention will be more fully understood from the following detailed description taken in conjunction with the accompanying drawings in which.

DETAILED DESCRIPTION OF THE INVENTION

Figure 1:
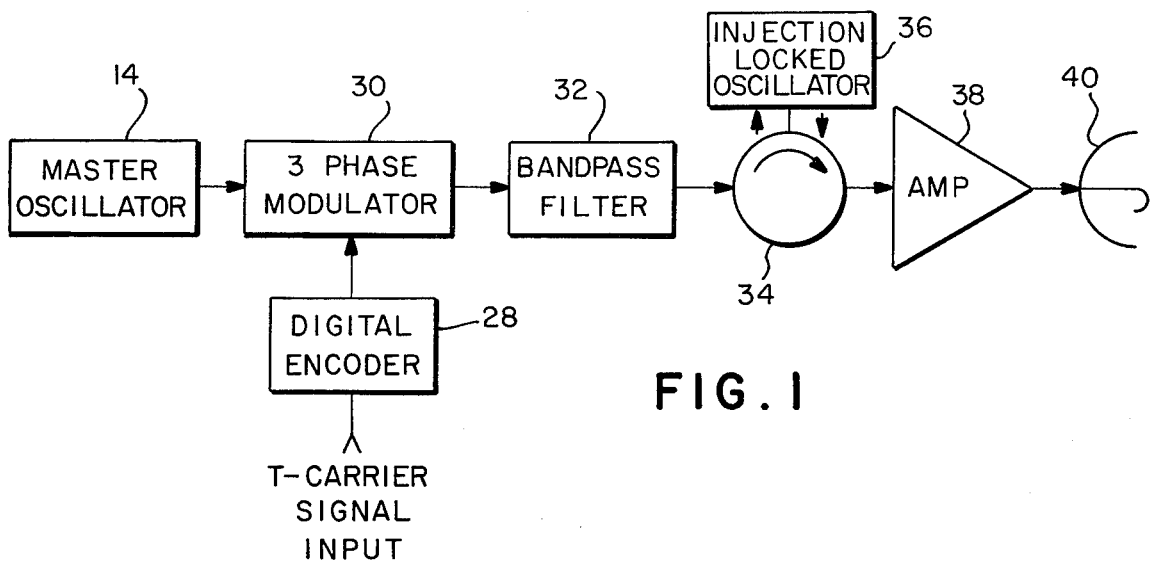
FIG. 1 is a diagrammatic representation of a digital microwave transmitter employing a modulator according to the invention.

A digital microwave transmitter employing the invention is shown in FIG. 1. The transmitter includes a digital encoder 28 which receives the multiple level input modulation signal and which provides a correspondingly coded digital control signal to a modulator 30 embodying the invention, which also receives a carrier signal from a master oscillator 14. The phase-modulated output signal from modulator 30 is applied to a bandpass filter 32, the output of which may be applied to a circulator 34 through which it is conveyed to an injection-locked oscillator 36, such as a Gunn-effect or other suitable oscillator. The oscillator 36 functions as a limiting amplifier to provide an output signal relatively free of amplitude modulation, and locks the frequency of the output signal thereof to the frequency of the injected signal. The output of the circulator 34, which is the phase-modulated carrier signal is amplified by a microwave amplifier 38 and propagated by microwave antenna 40. Alternatively, the output of modulator 30 may be applied directly to antenna 40 or otherwise directly propagated over a transmission path.

Figure 2:
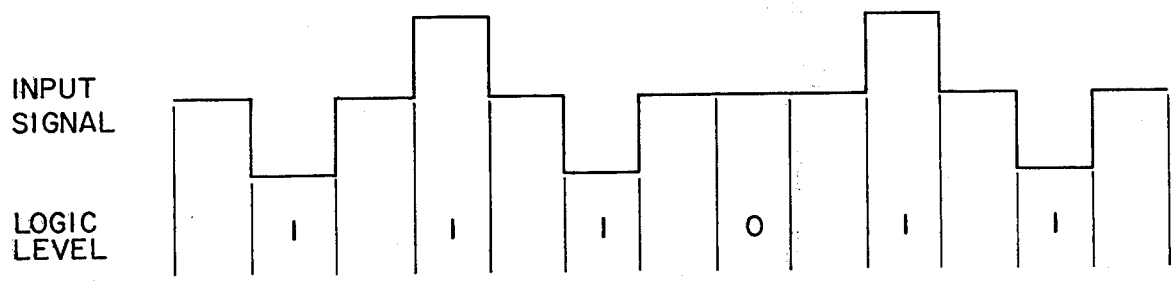
FIG. 2 is a plot of a modulation signal of a type with which the invention is employed.

A signal of the type with which the invention can be employed is shown in FIG. 2 and is seen to be a bipolar signal having a 50% duty cycle. The illustrated signal format is known as a T-format or T-carrier signal and is widely employed in digital communications systems and is itself of well known signal form. The T-carrier communication format is more fully discussed in *Transmission Systems for Communications*, Fourth Edition, pp. 553–565, published by Bell Telephone Laboratories, Incorporated. The signal is seen to have three levels or amplitude states, a zero or reference level, a positive unit amplitude level and a negative unit amplitude level. Information is coded by the presence or absence of signal pulses. Typically, the presence of a pulse, either positive or negative, represents data of one binary value, while the absence of a signal pulse represents data of opposite binary value. Signal pulses alternate in polarity such that a time average of essentially zero amplitude is maintained. The multilevel signal is transmitted as a phase-coded representation thereof and can be directly translated back to multilevel form without need for recovering clock or timing information. The signal employed with the invention may be of other multilevel forms, such as a two level or square wave signal, and need not exhibit a 50% duty cycle. The modulation signal may have any number of discrete amplitude levels, so long as a reference signal having zero average amplitude can be derived from the resultant phase coded signal.

Figure 3:
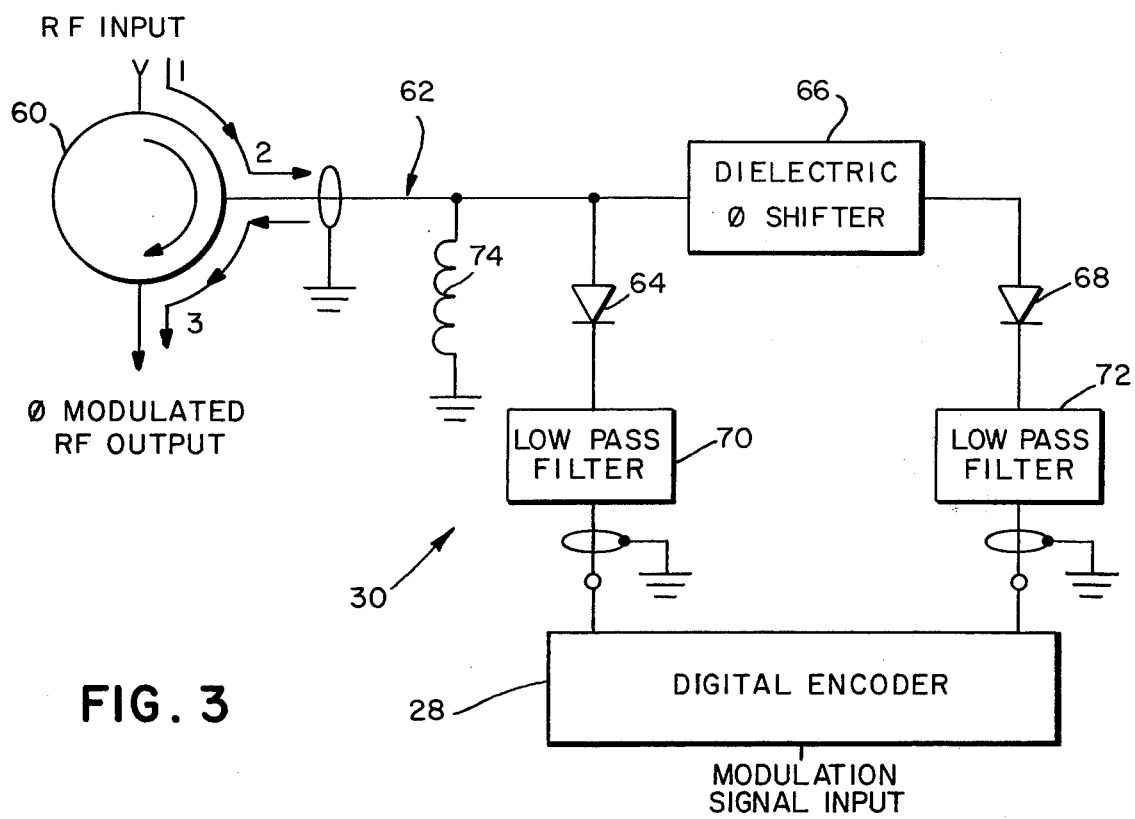
FIG. 3 is a schematic representation of a modulator according to the invention.

A preferred embodiment of the modulator 30 is shown schematically in FIG. 3. Referring to FIG. 3, there is shown a three-port circulator 60 having a first port coupled to receive the RF input signal and a second port coupled via a transmission line 62 to the anode of a first Schottky diode 64, and thence through a dielectric phase shifter 66 to the anode of a second Schottky diode 68. The cathodes of diodes 64 and 68 are coupled through respective low pass filter networks 70 and 72 to digital encoder 28 which provides biasing control signals for the respective diodes. The filters 70 and 72 provide a high frequency ground return for the phase-modulated signals and couple the direct current control signals to the diodes. A direct current return path to ground is provided by an inductor 74 or other conductive link coupled between the center conductor of transmission line 62 and ground. The dielectric phase shifter 66 provides a predetermined electrical separation and therefore phase delay between diodes 64 and 68 in accordance with the carrier frequency and phase coding employed. The third port of circulator 60 provides the phase-modulated RF output.

The Schottky diodes function as bias voltage responsive variable impedance signal reflection means for modulating the phase of the microwave carrier signal introduced by way of circulator 60 into the transmission line 62. The digital encoder 28 received the bipolar modulator signal, such as the T-carrier signal described above, and provides appropriate bias control signals to diodes 64 and 68 according to the amplitude state of the modulating signal. The RF carrier signal undergoes reflection in accordance with the equivalent complex impedance and electrical separation of the diodes, which determine the relative phase of the reflected wave. The reflected wave is received at the second port of circulator 60 and is conveyed to the third or output port thereof to provide the phase-modulated output signal. In the illustrated embodiment employing a T-carrier signal, a phase-modulated signal is provided having three discrete phase states directly corresponding to the three amplitude states of the input signal.

With diode 64 forward biased by a control signal from encoder 28, a zero phase reference state is defined. This reference state may be defined in association with a selected biased state of diode 68. A positive phase state is provided with diode 64 reverse biased and diode 68 forward biased, while a negative phase state is provided with both diodes being reverse biased. In the illustrated embodiment, the phase states are selected to be +90° and −90° relative to a reference phase and corresponding to the amplitude states of the T-carrier signal as shown in FIG. 2. The modulator thus provides a phase-modulated output signal directly corresponding to the modulating input signal. It is contemplated that other phase states either greater than or less than ±90° can be selected with equal facility.

The specific combination of phase states provided at the output of the novel modulator is established by three variables; namely, the complex impedance of the modulating diodes, the characteristic impedance of the transmission line to which the diodes are coupled and the electrical separation between the modulating diodes. In the present invention, the electrical separation between the modulating diodes is determined by a dielectric phase shifter, and it will be appreciated that different phase shifters have requisite dielectric characteristics can be employed in the modulator to accommodate different carrier frequencies without material modification of the remaining modulator structure.

Figure 4:
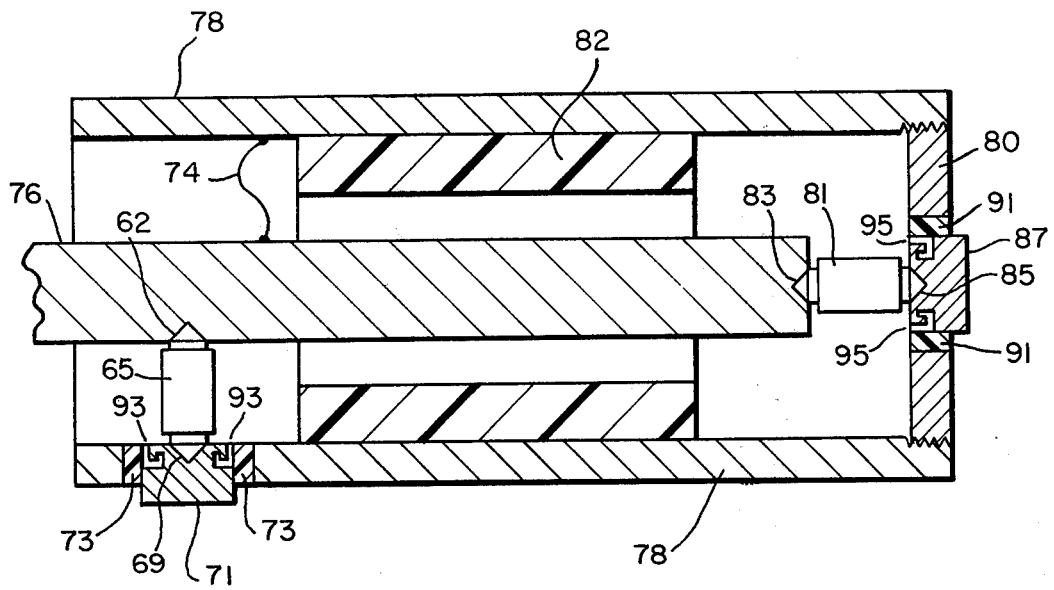
FIG. 4 is a cross-sectional view of a microwave modulator constructed according to the invention.

A microwave phase modulator embodying the invention is shown in FIG. 4. A coaxial transmission line composed of an inner conductor 76 and a surrounding outer conductor 78 is coupled to the second port of circulator 60 (FIG. 3) by a suitable coaxial connector (not shown). A first diode package 65 is disposed in the position shown with its anode terminal 62 in electrical connection with inner conductor 76 and its cathode terminal 69 in electrical connection with a conductive member 71. The member 71 is disposed in an opening provided in outer conductor 78 and is insulated therefrom by means of an annular sleeve 73. A second diode package 81 is disposed at the end of the modulator structure as shown with anode terminal 83 connected to the end of inner conductor 76 and cathode terminal 85 connected to conductive member 87 which is disposed within an opening in end plate 80 and insulated therefrom by an insulative sleeve 91. The conductive members 71 and 87 serve as input terminals for the digital control signals applied to the respective diodes. The members 71 and 87 include respective air chokes 93 and 95 which can be of any well-known form and which provide RF coupling of the diodes to the outer conductor 78. A suitable DC return path is provided between conductors 76 and 78 such as by conductive element 74.

An annular cylinder 82 of dielectric material forms a core disposed in the space between conductors 76 and 78 and between diode packages 65 and 81 and is operative as a dielectric phase shifter to provide predetermined electrical separation between the microwave diodes at the selected carrier frequency. In the illustrated embodiment, the cylinder 82 is shown in contact with the inner surfaces of outer conductor 78, but it will be appreciated that the dielectric cylinder can be disposed in any convenient manner within the modulator structure. The cross-sectional fill factor and length of the dielectric cylinder 82 in conjunction with its dielectric characteristics are selected in a well-known manner to provide an intended electrical separation between the diodes and desired phase separation between states. The modulator may be adapted to operate at different carrier frequencies or to have different phase separations between selected states simply by replacing the dielectric cylinder 82 with another dielectric member. For a given set of diodes, the modulator structure need not otherwise be changed.

The phase-modulated output signal provided at the third terminal of circulator 60 can be directly applied to a transmitting antenna or other transmitting means for direct propagation to a receiving station. However, the phase-modulated output signal can be subject to amplitude variations between the several phase states of the modulated output signal. Such amplitude variations can be minimized by appropriate modulator design. As a further embodiment, means may be provided for eliminating amplitude differences among states of the modulated output. One such embodiment is illustrated in FIG. 1 wherein the output of the phase modulator 30 is provided through bandpass filter 32 and circulator 34 to injection-locked oscillator 36. It is characteristic of an injection-locked oscillator that within a range of the bandwidth to which the oscillator is capable of locking to an injected signal, saturation amplification occurs without significantly changing the phase of the input signal. Therefore, a multiple phase output signal can be provided substantially free of amplitude variations. In particular embodiment, a phase-modulated signal is directed through circulator 34 to a Gunn-effect oscillator operating in an injection-locked mode.

Various modifications and alternative implementations will become apparent to those versed in the art without departing from the true scope of the invention. Accordingly, it is not intended to limit the invention by what has been particularly shown and described, except as indicated in the appended claims.

What is claimed is:

1. A phase modulator for a digital communication transmitter having as a modulation signal a multiple level signal with a time average of substantially zero amplitude, said phase modulator comprising:
    means for receiving a carrier signal of predetermined frequency;
    a transmission line coupled to said receiving means for propagation of said carrier signal;
    a plurality of bias responsive variable impedance means coupled to said transmission line at predetermined spaced positions;
    phase-shifting means disposed in the propagation path of said transmission line between said variable impedance means and having a dielectric core at least partially filling the space beween the transmission line conductors, the material and geometry of said dielectric core being such to result in a predetermined electrical separation between said variable impedance means and a predetermined impedance level of the transmission line as seen by the variable impedance means;
    digital encoder means operative in response to said modulation signal to provide respective bias signals to said variable impedance means; and
    means coupled to said transmission line for providing a phase-modulated output signal having phase states directly corresponding to the amplitude states of said multiple level modulation signal.

2. A phase modulator according to claim 1 further including means operative in response to said phase-modulated output signal to substantially eliminate amplitude differences between the phase states of the modulated signal.

3. A phase modulator according to claim 2 wherein said lastnamed means includes an injection-locked oscillator operative to provide said phase-modulated signal substantially free of amplitude variations.

4. A phase modulator for a digital communication transmitter comprising:
    a circulator having first, second and third ports, said first port being operative to receive a carrier signal of predetermined frequency, said second port being operative to provide said carrier signal to a transmission line and to receive a reflected carrier signal from said transmission line, said third port being operative to provide a phase-modulated output signal;
    a transmission line coupled to the second port of said circulator and operative to propagate said carrier signal therealong;
    a plurality of bias controlled variable impedance means disposed at predetermined spaced positions along said transmission line;
    phase-shifting means disposed in the propagation path of said transmission line between said variable impedance means and having a dielectric core at least partially filling the space between the transmission line conductors, the material and geometry of said dielectric core being such to result in a predetermined electrical separation between said variable impedance means and a predetermined impedance level of the transmission line as seen by the variable impedance means; and
    encoder means operative in response to a multiple level input signal having a time average of substantially zero amplitude to provide respective bias signals to said variable impedance means;
    said variable impedance means being selectively forward biased and reverse biased in response to said bias signals to provide selected reflection of said carrier signal along said transmission line thereby to produce at the third port of said circulator a phase-modulated output signal having phase states directly corresponding to the amplitude states of said input signal.

5. A phase modulator according to claim 4 wherein said variable impedance means are microwave diodes providing a first complex impedance when forward biased and a second complex impedance when reverse biased.

6. A phase modulator according to claim 5 wherein said transmission line includes a coaxial transmission line having inner and outer conductors;
    and wherein said dielectric core is disposed symmetrically around the inner conductor between said variable impedance means at least partially filling the space between the inner and outer conductors of said coaxial transmission line between said variable impedance means;
    and wherein each of said variable impedance means includes a microwave diode having one terminal connected to the inner conductor of said coaxial transmission line at a selected position and a second terminal connected via a choke to a control terminal to which said bias signals are coupled.

7. A phase modulator according to claim 4 wherein said multiple level input signal for said encoder means is a T-carrier signal having three amplitude levels and a time average of zero amplitude;

and wherein said phase-modulated output signal provided at the third port of said circulator has three phase states each directly corresponding to a negative amplitude state of said multiple level signal and having a time average of zero phase.

8. A phase modulator according to claim 7 wherein said variable impedance means include first and second microwave diodes coupled to said transmission line and having an electrical separation determined by said dielectric material disposed therebetween.

9. A microwave phase modulator for a digital communication transmitter comprising:

a circulator having first, second and third ports, said first port being operative to receive a carrier signal of predetermined frequency, said second port being operative to provide said carrier signal to a transmission line and to receive a reflected carrier signal from said transmission line, said third port being operative to provide a phasemodulated output signal;

a transmission line coupled to the second port of said circulator and operative to propagate said carrier signal therealong;

first and second bias controlled variable impedance means disposed at predetermined spaced position along said transmission line and each providing a selective load impedance for said transmission line;

phase-shifting means disposed in the propagation path of said transmission line between said variable impedance means and having a replaceable dielectric core at least partially filling the space between the transmission line conductors, the material and geometry of said replaceable dielectric being such to result in a predetermined electrical separation between said variable impedance means and a predetermined impedance level of the transmission line as seen by the variable impedance means; and encoder means operative in response to a multiple level input signal having a time average of substantially zero amplitude to provide respective bias signals to said variable impedance means;

said variable impedance means being selectively forward biased and reverse biased in response to said bias signals to provide selected reflection of said carrier signal along said transmission line thereby to produce at the third port of said circulator a phase-modulated output signal having phase states directly corresponding to the amplitude states of said input signal.

* * * * *

UNITED STATES PATENT AND TRADEMARK OFFICE
CERTIFICATE OF CORRECTION

PATENT NO. : 3,967,217
DATED : June 29, 1976
INVENTOR(S) : Arthur H. Solomon

It is certified that error appears in the above-identified patent and that said Letters Patent are hereby corrected as shown below:

Column 1, line 13, "of" should read --or--.
Column 3, line 16, "the" should read --this--.
Column 4, line 25, "have" should read --having--; and
line 35, "62" should read --67--.

In Fig. 4 of the drawing, "62" should read --67--.

Signed and Sealed this

First Day of February 1977

[SEAL]

Attest:

RUTH C. MASON
Attesting Officer

C. MARSHALL DANN
Commissioner of Patents and Trademarks